(12) United States Patent
Allerman et al.

(10) Patent No.: US 7,915,626 B1
(45) Date of Patent: Mar. 29, 2011

(54) ALUMINUM NITRIDE TRANSITIONAL LAYER FOR REDUCING DISLOCATION DENSITY AND CRACKING OF AlGaN EPITAXIAL FILMS

(75) Inventors: Andrew A. Allerman, Tijeras, NM (US); Mary H. Crawford, Albuquerque, NM (US); Daniel D. Koleske, Albuquerque, NM (US); Stephen R. Lee, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 74 days.

(21) Appl. No.: 11/504,885

(22) Filed: Aug. 15, 2006

(51) Int. Cl.
*H01L 29/22* (2006.01)
*H01L 29/24* (2006.01)
(52) U.S. Cl. .......................................... 257/95; 257/103
(58) Field of Classification Search .................... 257/94, 257/95, 101–103, E33.023, E33.028, E33.049, 257/E33.074
See application file for complete search history.

(56) References Cited

U.S. PATENT DOCUMENTS

| | | | |
|---|---|---|---|
| 6,534,332 B2 | 3/2003 | Bourret-Courchesne | |
| 6,690,700 B2 | 2/2004 | Takeuchi et al. | |
| 6,989,202 B2 | 1/2006 | Asai et al. | |
| 7,026,659 B2 * | 4/2006 | Slater et al. | 257/98 |
| 2003/0119239 A1 * | 6/2003 | Koike et al. | 438/200 |
| 2004/0157358 A1 * | 8/2004 | Hiramatsu et al. | 438/93 |
| 2005/0145864 A1 * | 7/2005 | Sugiyama et al. | 257/95 |

OTHER PUBLICATIONS

Yoshihiro Kida et al, "Metalorganic Vapor Phase Epitaxy Growth and Study of Stress in AlGaN Using Epitaxial AlN as Underlying Layer", Jpn. J. Appl. Phys. vol. 42, Part 2, No. 6A 2003, pp. L572-L574.
T. Wang et al, "Air-bridged lateral growth of an $Al_{0.98}Ga_{0.02}N$ layer by introduction of porosity in an AlN buffer", Applied Physics Letters, vol. 87, 2005, pp. 151906-1 through 151906-3.
Hiramatsu, Kazumasa et al, US20040157358A1: Group III nitride semiconductor film and its production method, six pages.

* cited by examiner

*Primary Examiner* — Hung Vu
(74) *Attorney, Agent, or Firm* — Carol I Ashby

(57) ABSTRACT

A denticulated Group III nitride structure that is useful for growing $Al_xGa_{1-x}N$ to greater thicknesses without cracking and with a greatly reduced threading dislocation (TD) density.

10 Claims, 10 Drawing Sheets

T = 940 °C

T = 970 °C

T = 1000 °C

V/III=50

V/III=121

V/III=336

H2 flow 2 slpm 9.5 slpm 17 slpm

ALUMINUM NITRIDE TRANSITIONAL LAYER FOR REDUCING DISLOCATION DENSITY AND CRACKING OF AlGaN EPITAXIAL FILMS

The United States Government has rights in this invention pursuant to Department of Energy Contract No. DE-AC04-94AL85000 with Sandia Corporation.

BACKGROUND OF THE INVENTION

The desire for UV-emitting photonic devices has produced much activity in the growth of $Al_xGa_{1-x}N$-based devices. A typical growth process by the metal-organic chemical vapor deposition (MOCVD) method for aluminum nitride or aluminum gallium nitride consists of the growth of a thin nucleation layer (typically less than 10 nm) at a temperature typically between 400° C. and 700° C. Common precursors when the nucleation layer is AlN are ammonia and trimethyl aluminum (TMA) mixed together in the deposition chamber or separately pulsed into the deposition chamber; typical pressures are between 40 and 150 Torr. Following the formation of this very thin nucleation layer, a thicker AlN or high-Al-content $Al_xGa_{1-x}N$ layer is grown at temperatures in excess of 1050° C. and at pressures typically below 150 Torr. Growth rates of the high-temperature AlN or $Al_xGa_{1-x}N$ layer under these conditions are typically near or less than about 1 micrometer per hour. For AlN films on sapphire substrates, threading dislocation densities with an edge or mixed edge+screw character are typically very high, greater than $1\times10^{10}/cm^2$. Much lower densities ($\leq 10^8/cm^2$) are highly desirable for devices. The growth of structures with epitaxial layer thicknesses in excess of 1 micrometer without cracking can be problematic as well with conventional growth techniques.

Wang et al. (T. Wang, J. Bai, P. J. Parbrook, and A. G. Cullis, "Air-bridged lateral growth of an $Al_{0.98}Ga_{0.02}N$ layer by introduction of porosity in an AlN buffer," Appl. Phys. Lett. vol. 87 (2005) pp. 151906-1-151906-3) reports significant dislocation reduction by introduction of a porous AlN buffer via metalorganic chemical vapor deposition. An approximately 500-nm AlN layer with a high density of pores was directly grown on a sapphire substrate at 1150° C. An important feature is pointed out that, although the column-like islands do not coalesce, the top of each island is very flat. Decreasing temperature and increasing V/III ratio can increase the area of the pores, resulting in a rough surface for the high-Al-composition AlGaN layer subsequently grown on the porous layer.

Kida et al. (Y. Kida, T. Shibata, H. Miyake, and K. Hiramatsu, "Metalorganic Vapor Phase Epitaxy Growth and Study of Stress in AlGaN Using Epitaxial AlN as Underlying Layer,' Jpn. J. Appl. Phys. Vol. 42, (3002) pp. L572-L574) report the growth of AlGaN on an AlN underlying layer. A epitaxial AlN film of 1 micrometer thickness grown on sapphire (0001) by low-pressure metalorganic vapor phase epitaxy (LO-MOVPE) was used as a substrate; it had an atomically flat surface.

Hiramatsu et al. (K. Hiramatsu, H. Miyake, H. Yoshida, T. Urushido, and Y. Terada, "Group III nitride semiconductor film and its production method," U.S. Patent Application No. 20040157358) reports a group III nitride semiconductor film involving few lattice defects and having a large thickness, and a process for making the film. Dry-etching is conducted while a quartz substrate and a group III nitride semiconductor are placed on the top of a lower electrode. Nano-pillars are formed on the top of the group III nitride semiconductor. Another group III nitride semiconductor film is deposited on the nano-pillars.

BRIEF DESCRIPTION OF THE DRAWINGS

The accompanying drawings, which are incorporated in and form part of the specification, illustrate some embodiments of the present invention and, together with the description, serve to explain the principles of the invention.

FIG. 2 illustrates an embodiment comprising a 1.2-micrometer-thick AlN denticulated layer.

DETAILED DESCRIPTION OF THE INVENTION

Figure 1A:
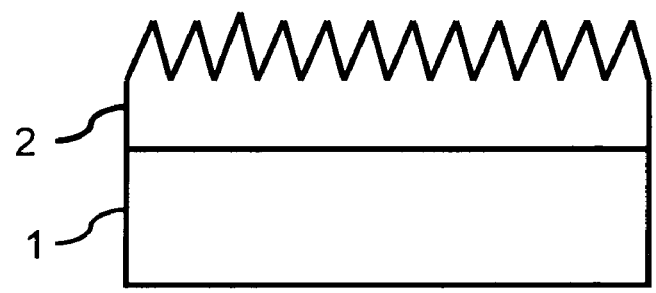
FIG. 1 illustrates several embodiments of the invention comprising a substrate and a denticulated group III nitride layer.
Figure 1B:
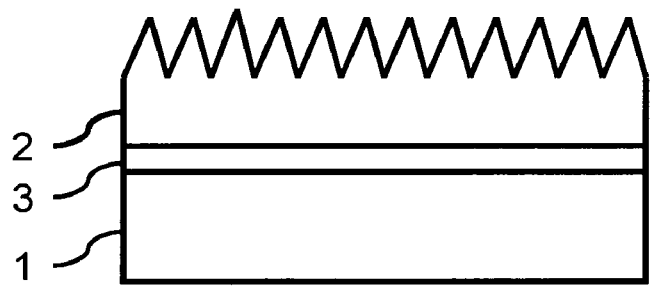
Figure 1C:
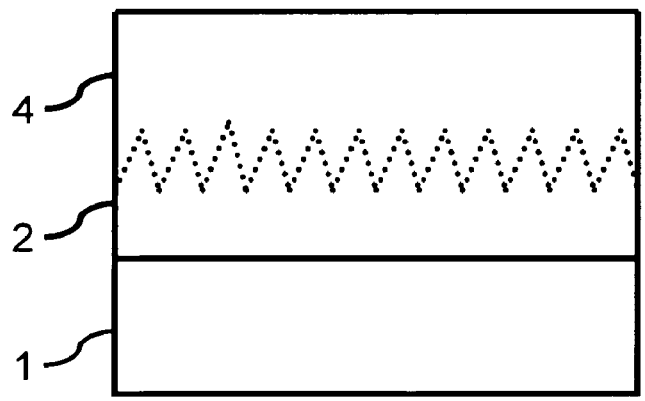
Figure 1D:
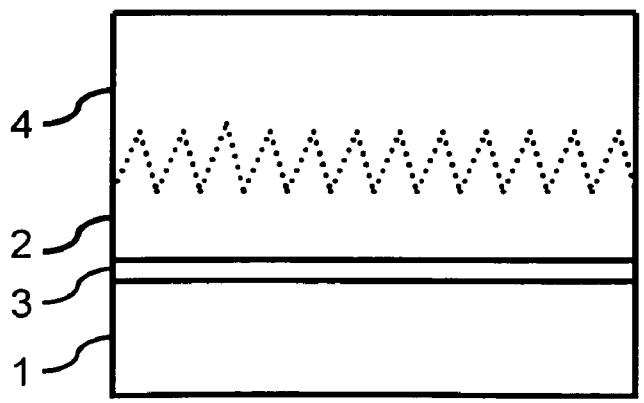

This invention comprises a denticulated Group III nitride structure that is useful for growing $Al_xGa_{1-x}N$ to greater thicknesses without cracking and with a greatly reduced threading dislocation (TD) density as compared with conventionally grown materials. Methods for growing embodiments of the invention comprise growing a denticulated Group III nitride layer. In some embodiments, a moderate temperature is employed during the growth of the denticulated layer. In some embodiments, this denticulated layer is situated as a transitional layer between a lower temperature nucleation layer and Group III nitride layer grown under higher temperature conditions typically employed for that Group III nitride material.

Some embodiments of denticulated Group III nitride layers are illustrated in FIG. 1. The structure illustrated in FIG. 1a comprises a substrate 1 and a denticulated Group III nitride layer 2. The structure illustrated in FIG. 1b comprises a substrate 1, a nucleation layer 3, and a denticulated layer 2. FIGS. 1c (without nucleation layer 3) and 1d (further comprising a nucleation layer 3) illustrate structures comprising a substrate 1, a denticulated layer 2, and a layer of Group III nitride 4 grown at higher temperature on the denticulated layer. The dotted lines are intended to represent the surface of the denticulated layer 2 prior to the growth of the higher temperature layer 4 upon the denticulated layer. Growth of additional group III nitride on the denticulated surface at the higher temperature layer leads to lateral growth and coalescence that obscures the previous location of the denticulated surface structure.

Figure 2A:
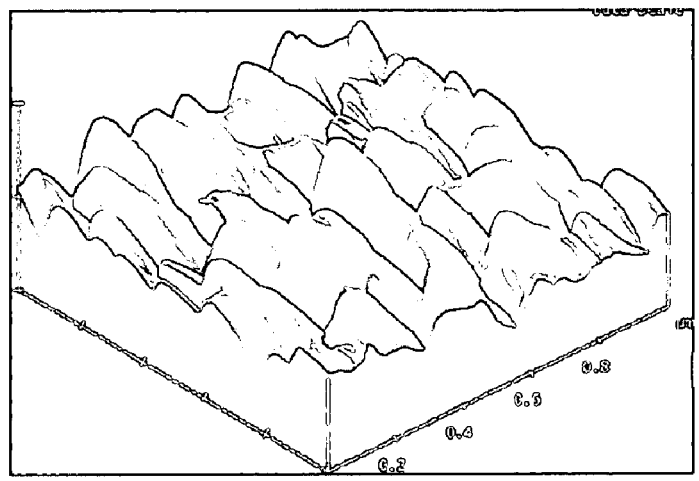
FIGS. 2a and 2b are atomic force microscope (AFM images)
Figure 2B:
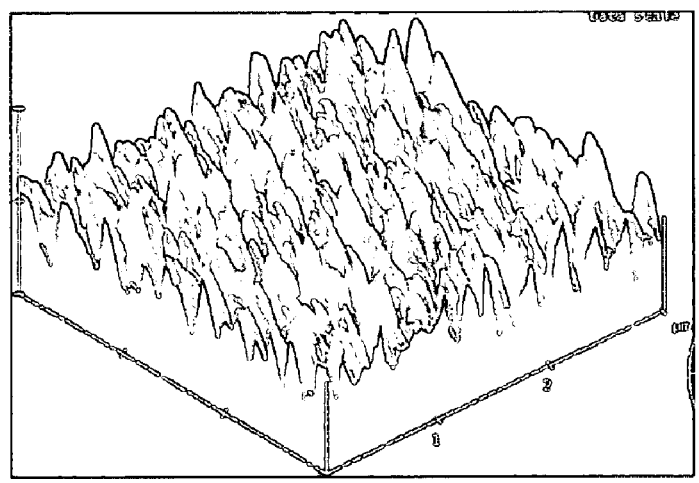
Figure 2C:
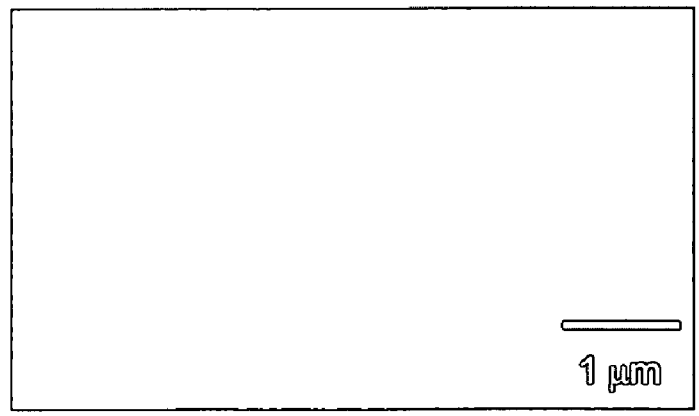
FIG. 2c is a scanning electron micrograph (SEM) image.
Figure 3A:
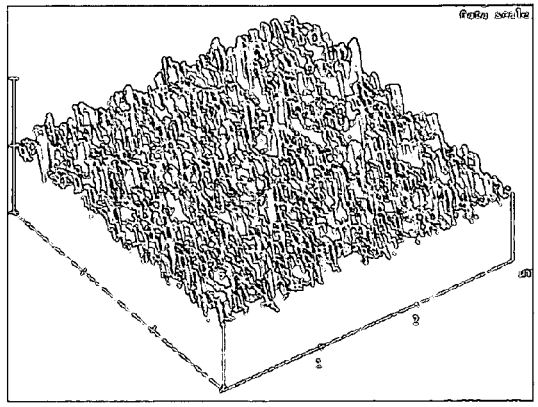
FIG. 3 illustrates the dependence of several embodiments comprising AlN denticulated surfaces on the denticulated layer thickness. a) layer thickness=0.11 micrometer: 20 nm/vertical division, rms 1.6 nm; b) layer thickness=0.25. micrometers: 40 nm/vertical division, rms 3.3 nm; c) layer thickness=0.47. micrometers: 100 nm/vertical division, rms 13.1 nm; d) layer thickness=0.80. micrometers: 300 nm/vertical division, rms 27.9 nm; e) layer thickness=1.2. micrometers: 250 nm/vertical division, rms 27.7 nm; 3×3 micrometer sample size for all. The denticulated layers were grown at 970° C. using a pressure of 75 Torr and a V/III ratio of 121, a $H_2$ flow of 9.5 slpm, and a molar flux of $11.9\times10^{-6}$ moles/min of trimethyl aluminum.
Figure 3B:
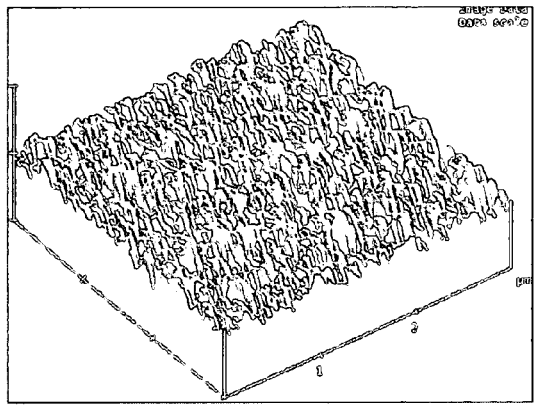
Figure 3C:
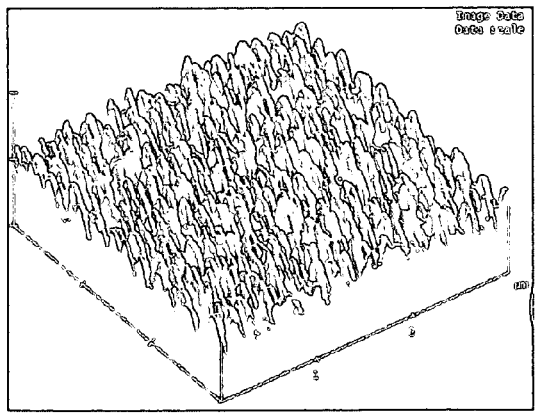
Figure 3D:
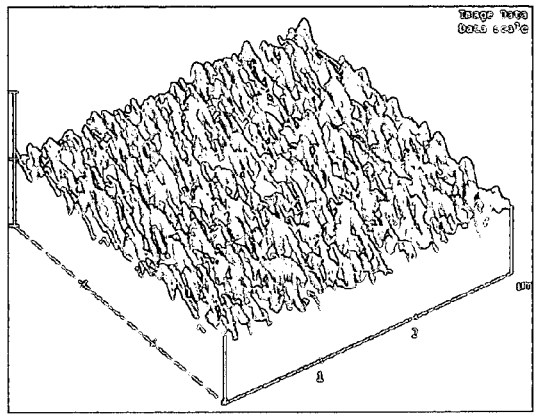
Figure 3E:
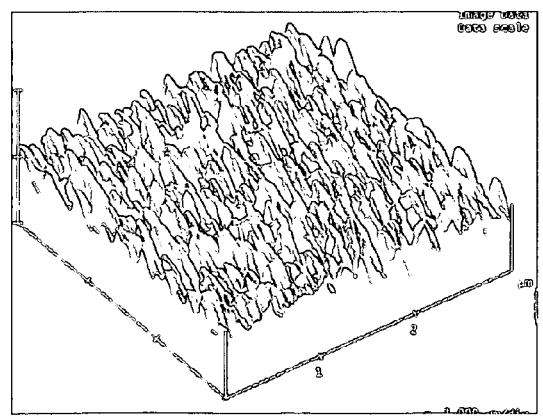

FIG. 2 illustrates a denticulated Group III nitride layer surface that is an embodiment of this invention. The embodiment illustrated in FIG. 2 comprises a 1.2-micrometer-thick AlN denticulated layer. FIGS. 2a and 2b are atomic force microscopy (AFM) images with FIG. 2a showing a 1×1 micrometer surface region with an rms roughness of 23.8 nm for the imaged area. FIG. 2b shows a 3×3 micrometer region of the same layer and has an rms roughness of 27.7 nm. FIG. 2c is a scanning electron micrograph (SEM) of the surface of the same sample.

Figure 4:
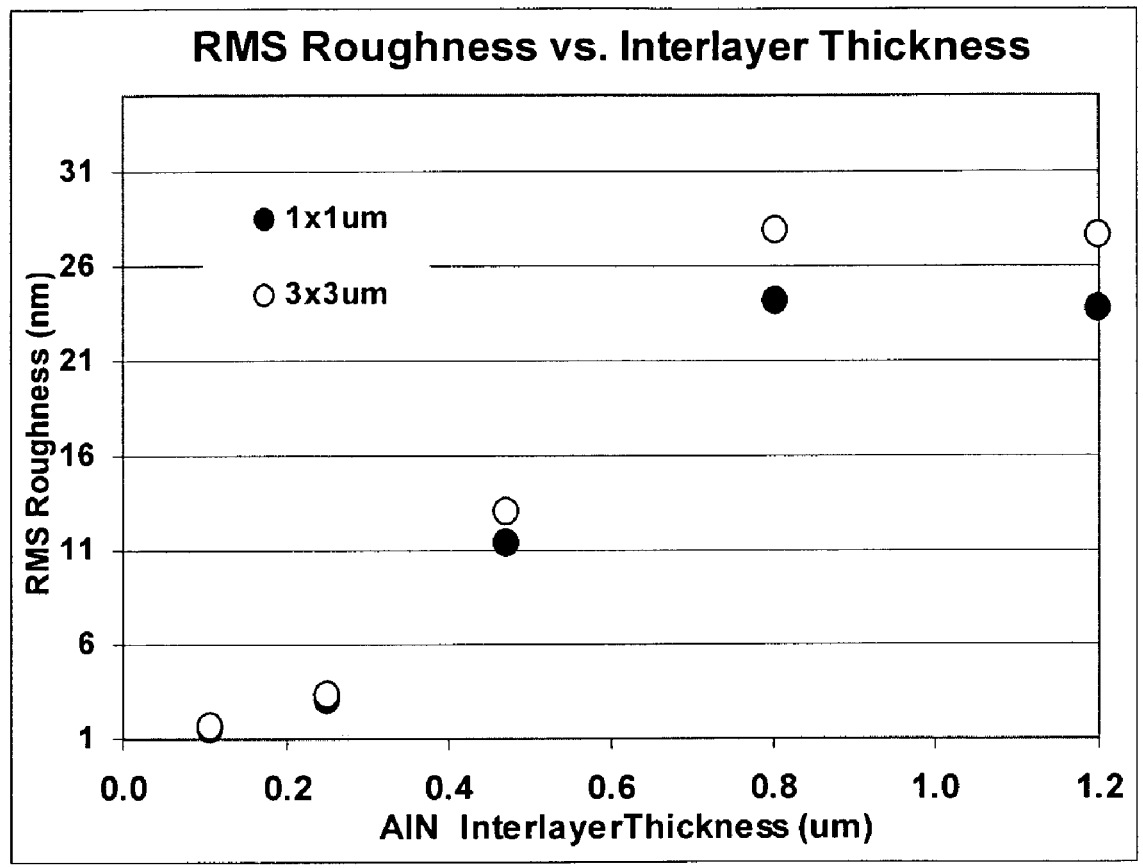
FIG. 4 illustrates a graph of rms roughness versus AlN denticulated layer thickness for 1×1 and 3×3 micrometer regions of the samples shown in FIG. 3.

FIG. 3 presents AFM images of the surface of several embodiments of the denticulated layer as a function of layer thickness. FIG. 4 graphs the rms roughness for the layers illustrated in FIG. 3 as a function of layer thickness. For thin layers (<0.3 micrometer), the formation of substantially similar denticles has not been achieved, as shown in FIGS. 3a and 3b. For the illustrated layer thickness of 0.43 and thicker, a substantially similar denticulated surface has been achieved. Embodiments of this invention that generate surfaces covered with denticles substantially similar to those in FIGS. 3c, 3d, and 3e, that is, generally tooth-like, can be used as growth substrates for subsequently high-temperature Group III nitride growth where the thickness for onset of cracking is substantially increased. Denticulated surfaces substantially similar to those shown in FIGS. 3c, 3d, and 3e also produce a reduction in the edge-component threading dislocation density in the high-temperature Group III nitride layers grown on top of them. Denticulate layers are grown at moderate temperatures, as described below, rather than at the high temperatures typically employed for Group III nitride growth.

Figure 5A:
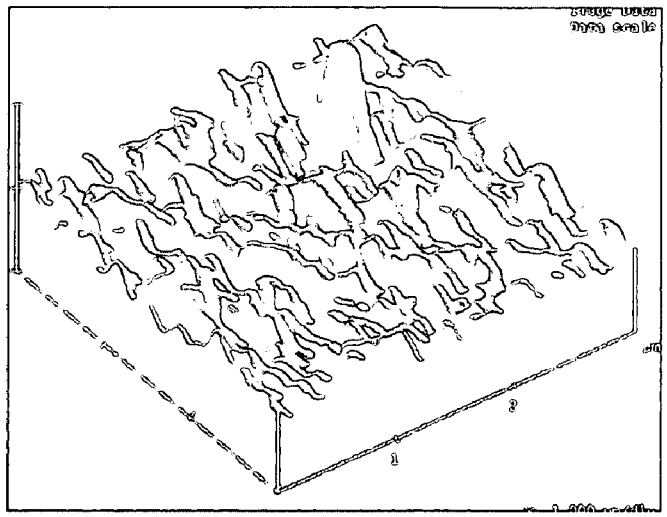
FIG. 5 illustrates the effect of temperature on the surface texture of an AlN denticulated surface. Growths were performed at 75 Torr, $11.9\times10^{-6}$ moles/min of trimethylaluminum (TMA), V/III ratio of 121, $H_2$=9.5 slpm. Temperatures were a) 940° C.; b) 970° C.; c) 1000° C.
Figure 5B:
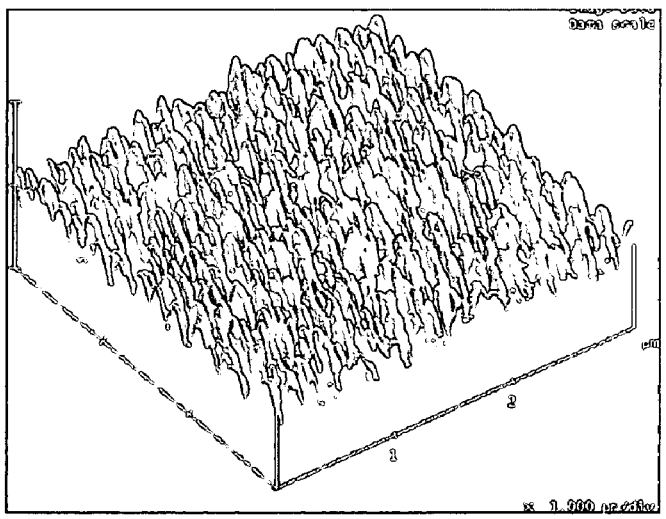
Figure 5C:
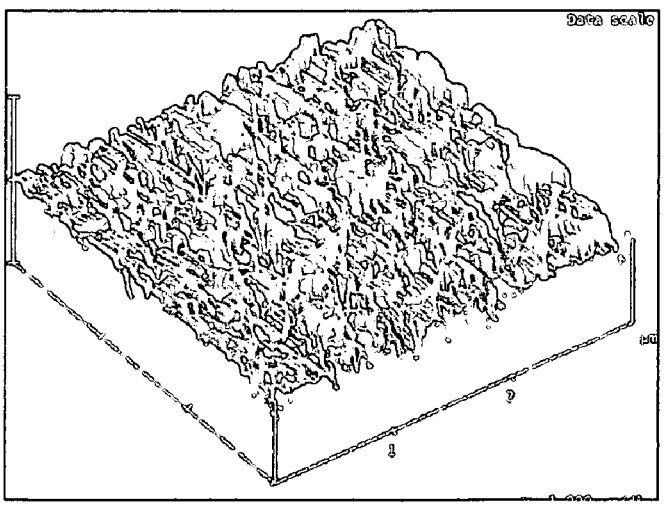

The growth conditions for the denticulated group III nitride layer in some embodiments are as follows. A growth pressure of 75 Torr is used for some embodiments; pressures up to 300 Torr have been used in some embodiments. Higher pressures, up to 1000 Torr, and lower pressures, down to 40 Torr, may also be used. In many embodiments, the transitional layer is grown at approximately 970° C.; other embodiments can employ temperatures between 900° C. and 1020° C. This temperature range is defined as moderate temperature. Temperatures in excess of about 1000° C. are typically used in what is termed "high temperature" growth. FIG. 5 illustrates the dependence of surface structure on temperature for growth conditions of 75 Torr, $11.9 \times 10^{-6}$ moles/min of trimethylaluminum (TMA), V/III ratio of 121, $H_2$=9.5 slpm in a commercial short-jar nitride metalorganic chemical vapor deposition (MOCVD) reactor. The V/III ratio is calculated using the molar flux of $NH_3$ (@ STP, 22.4 slpm=1 mole of $NH_3$, $6.023 \times 10^{23}$ N atoms per mole of $NH_3$) and 2 times the molar flux of TMA to account for the diatomic nature of the TMA molecule as it is transported in the vapor phase. The combination of gas flows and pressures that will properly produce the denticulated structure at a particular moderate temperature will be partially dependent on the operating characteristics of a particular reactor and can be determined without undue experimentation by those skilled in the MOCVD art. Other growth techniques, such as hydride vapor phase epitaxy, can also be used in embodiments of this invention. The growth conditions for embodiments reported herein are suitable for the reactor employed; some modification may be required for other reactors. When a surface looks like FIG. 5a, the denticulate structure has not sufficiently formed. FIG. 5b illustrates a well-formed denticulated surface that works well for reducing cracking and threading-dislocation density in subsequent high-temperature growths. FIG. 5c shows a surface that is characterized by vertically oriented platelets, sometimes with extended interconnection between adjacent plates producing plateau-like features, rather than by substantially conical denticles. Embodiments of this invention have denticulated surfaces, as in FIG. 5b, rather than the more plateau-like features shown in the higher-temperature surface of FIG. 5c. The specific temperature where the denticulated surface is optimized will depend somewhat on the reactor conditions, but should be in most embodiments between 940 and 1000° C.

Figure 6A:
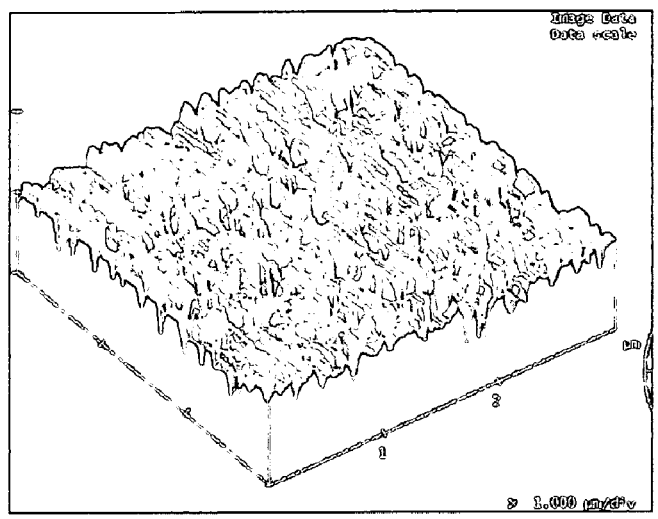
FIG. 6 illustrates the effect of V/III ratio on the surface texture of an AlN denticulated surface. Growths were performed at 75 Torr, trimethyl aluminum (TMA)=33 sccm, $H_2$=9.5 slpm. a) $NH_3$=27 sccm, V/III=50; b) $NH_3$=65 sccm, V/III=121; c) $NH_3$=180 sccm, V/III=336.
Figure 6B:
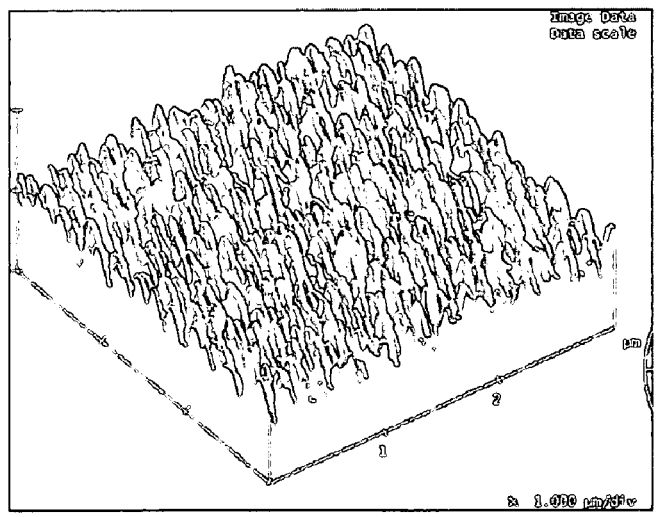
Figure 6C:
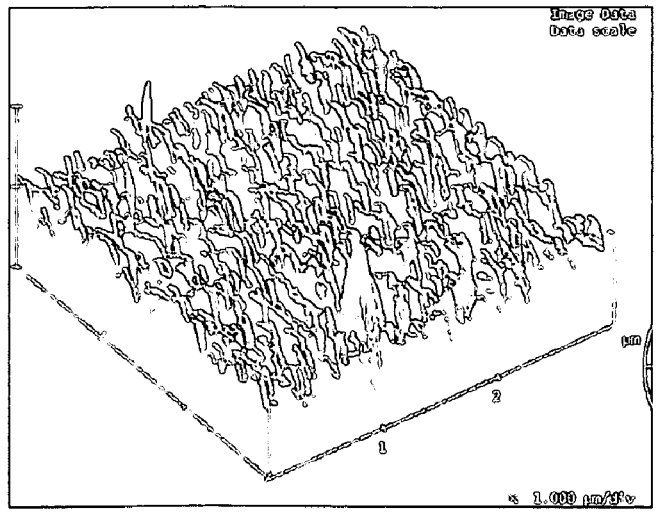

In some embodiments, an ammonia flow of 65 sccm or a V/III ratio of 121 are used for a growth rate of approximately 0.3 micrometers/hour. FIG. 6 illustrates the effect of ammonia flow when growing the denticulated layer at 970° C. When growing at an approximately 0.3 micrometer/hour rate, a V/III ratio of 50 is sufficiently low that less surface roughness is obtained. Under these conditions, a surface that is characterized by vertically oriented platelets, sometimes with extended interconnection between adjacent plates producing plateau-like features, rather than by substantially conical denticles, is obtained. Increased ammonia flow produced a denticulated surface (FIG. 6b.) In some embodiments, a V/III ratio as high as 336 has provided growths with good surface roughness. FIG. 6c shows a substantially denticulated surface. It is likely that higher V/III ratios will also work well as long as a substantially denticulated surface is formed. For AlN, trimethyl aluminum (TMA) has been employed as the group III precursor. Other Al precursors, such as triethylaluminum, eimethylethylamine alane, trimethylamine alane, dimethylaluminum hydride and tritertiarybutylaluminum may also be used. For group III nitrides comprising Ga as a group III element, trimethyl gallium (TMG) and triethylgallium, and triisopropylgallium may be used. Successful growth of a denticulated surface has been achieved for V/III ratios from approximately 120 to 270. However, some reduction in dislocation density and improved resistance to cracking should be achieved from layers grown with V/III ratios down to 25 and higher than 330.

In some embodiments, growth rates on the order of 1 micrometer/hour have produced good surface roughness; other growth rates may also be used provided they correspond to a surface with an appropriate level of roughness. Growth rates and conditions that produce denticulated surfaces are good for the purpose of dislocation and cracking reduction.

Figure 7A:
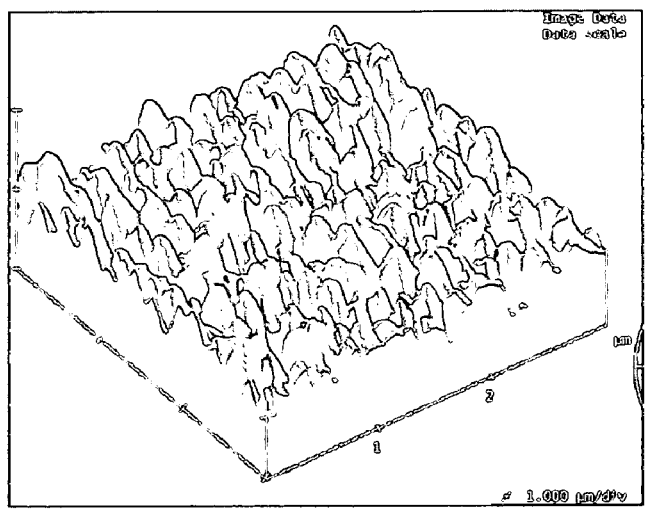
FIG. 7 illustrates the effect of hydrogen carrier gas flow on the surface texture of an AlN denticulated surface. Growths were performed at 75 Torr, $11.9\times10^{-6}$ moles/min of trimethylaluminum (TMA), V/III ratio of 121 $H_2$ flows were a) 2 slpm; b) 9.5 slpm; c) 17 slpm.
Figure 7B:
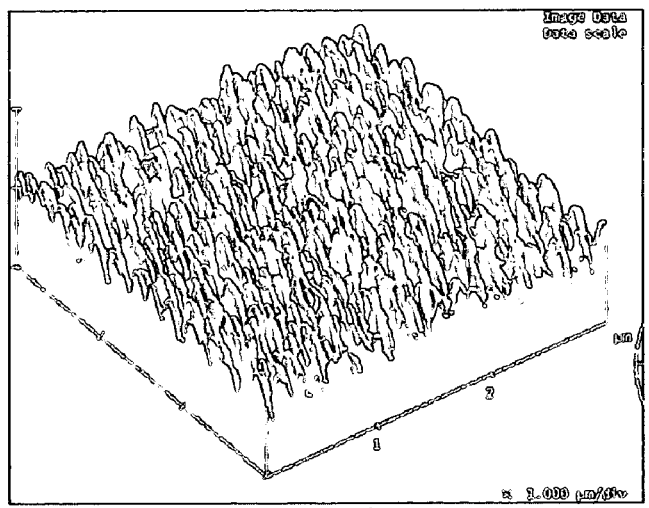
Figure 7C:
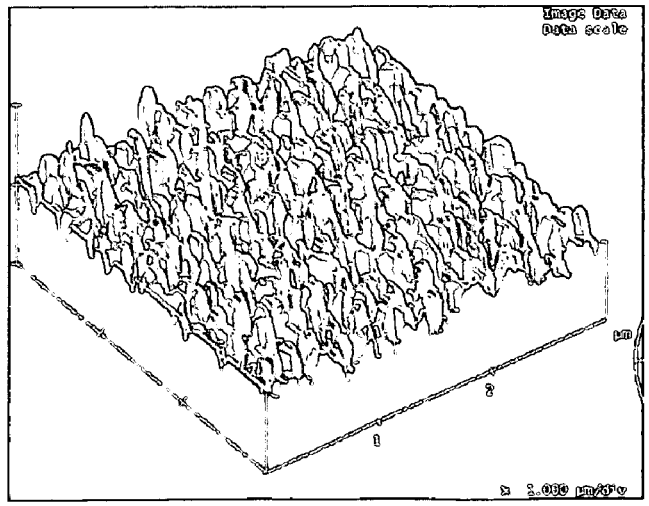

In some embodiments, hydrogen gas flow rates of 10-13 slpm are used; flows down to approximately 2 slpm and up to approximately 17 slpm have provided good surface roughness. FIG. 7 illustrates the AFM images of surfaces growth at 970° C. with different hydrogen flow rates. Lower or higher hydrogen flow rates can be used in some embodiments if they produce substantially denticulated surfaces.

The formation of a denticulated surface leads to marked reduction in threading dislocations and an increase in the thickness that can be grown without cracking. Reaction conditions that produce short ridges, as shown in FIGS. 5c and 6a may provide some improvement, but these surfaces do not produce as great a benefit as is obtained with a denticulated surface.

In some embodiments, a transitional-layer thickness between 100 nm and 500 nm are employed. In other embodiments, transitional-layer thicknesses between 40 nm and 1.2 micrometers in thickness can be used. In other embodiments, transitional-layer thicknesses between 0.4 micrometers and 1.2 micrometers can been used to produce decreases in threading dislocation density and increases in the thickness of group III nitride that can be grown on top of the denticulated layer before cracking occurs. Thicker layers may also be useful provided they have a denticulated surface texture. Considerations in selecting the thickness of the denticulated layer include the dislocation density that is required for a particular application and the amount of time required to grow the layer. When growing at moderate temperatures, a rough surface is generated during layer growth and, below a certain transitional-layer thickness, the surface becomes rougher as the layer grows. Past a certain thickness depending on growth conditions, the roughness may remain approximately constant as the transitional layer thickness increases over a range depending on growth conditions. High-temperature group III nitride layers grown on thicker denticulated layers have lower in-plane strain; this permits growth of thicker high-temperature layers before the strain causes cracking of the layer. As the transitional layer thickness increases, a thicker layer of high-temperature-grown III-N can be grown on top of the transitional layer before cracking is observed. For example, AlN films grown on sapphire at high temperature (for example, 1100° C.) without an AlN denticulated transitional layer typically form cracks at thicknesses between 0.7 and 1 micrometer. Based on residual strain of the high temperature AlN layer measured by x-ray diffraction, a transitional layer of 0.3 micrometer thickness permits growth of a 1.4-micrometer high-temperature layer before cracking. This transitional-layer structure has a tensile strain of $1.6 \times 10^{-3}$ at the growth temperature. Thicker transitional layers permit growth of thicker crack-free layers upon the transitional layer. For example, 4 micrometers of AlN have been grown on a 0.75-micrometer-thick denticulated transitional layer. The strain is much lower ($4 \times 10^{-4}$) and a representative calculation predicts that a layer of 37 micrometers would be possible before cracking with such a low strain value.

Figure 8:
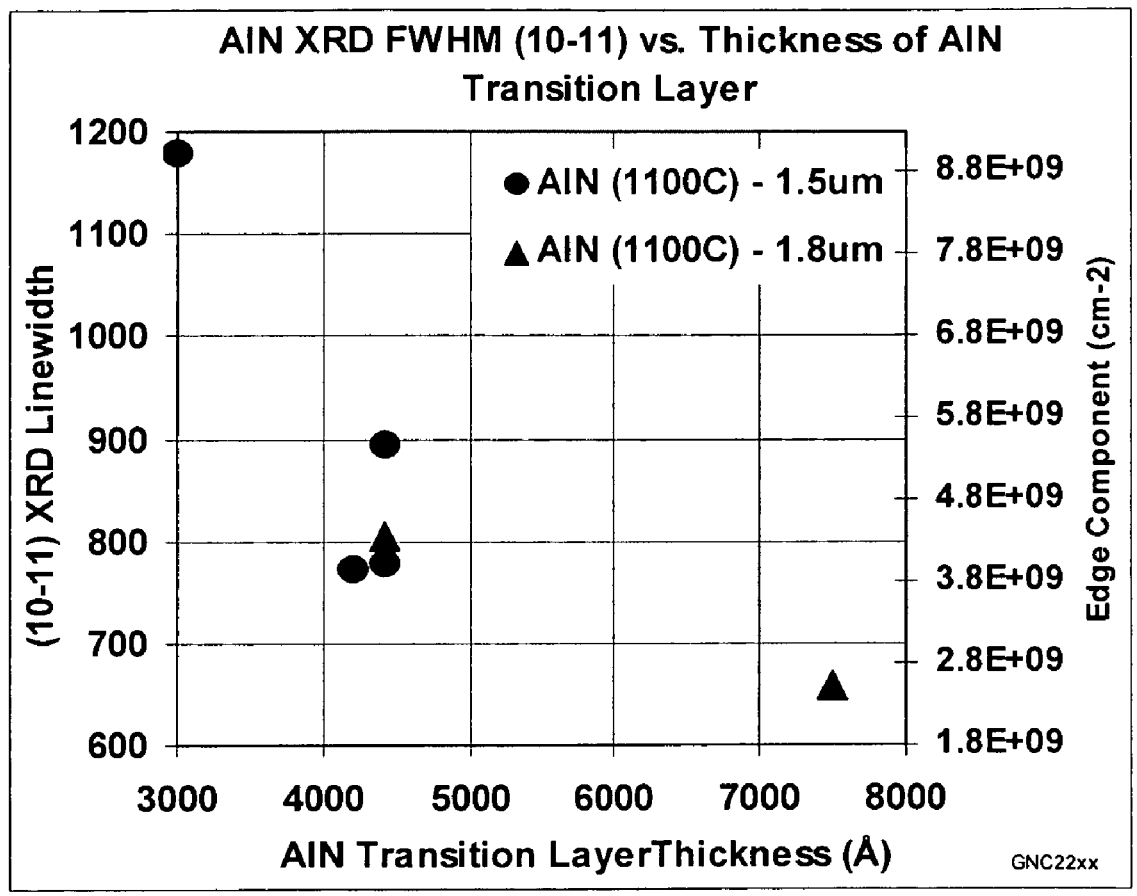
FIG. 8 illustrates the reduction of the density of edge-component threading dislocation in two samples of high-temperature AlN grown on denticulated AlN layers as a function of increasing denticulated layer thickness (AlN transition layer thickness).

In addition to an increased thickness before cracking, the high-temperature AlN layer has a much lower threading dislocation density. A representative aluminum nitride film grown without a transitional layer had a density of dislocations with an edge component of $1.2 \times 10^{10}/cm^2$ and was restricted to a thickness of 0.76 micrometers to avoid cracking. A 3-micron AlN layer grown with the transitional layer having a thickness of approximately 0.45 micrometers has been determined by X-ray diffraction to contain approximately $1-3 \times 10^8/cm^2$ screw-component threading dislocations and $2-3 \times 10^9\ cm^2$ edge-component threading dislocations. An AlN layer grown on an 0.88 micrometer AlN denticulated transitional layer displayed a density of screw-component threading dislocations of approximately $1.1 \times 10^8/cm^2$) and a density of edge-component threading dislocations of $9.5 \times 10^8\ cm^2$ based on X-ray diffraction measurements. Surfaces of the high-temperature AlN layer grown on a denticulated transitional layer are featureless under Nomarski microscopy and exhibit AFM RMS values less than 0.7 nm over 10×10 square micrometer areas. FIG. 8 illustrates the dependence of the edge-component threading dislocation density on AlN denticulated layer thickness (transition layer thickness) for high-temperature AlN layers of 1.5 and 1.8 micrometer grown at 1100° C. The method used to determine dislocation density using X-ray diffraction is described in S. L. Lee, Appl. Phys. Lett. vol. 86 (2005) p 241904.

In several embodiments, an AlN nucleation layer of approximately 10 nm thickness was grown on a sapphire substrate. In some embodiments, the nucleation layer is grown at a low temperature, typically between 400 and 700° C. A denticulated AlN transitional layer was grown to a thickness of approximately 0.4 micrometers using a pressure of 75 Torr, a V/III ratio of 121 with the V source being ammonia and the III source being trimethyl aluminum, a group-III flux between 16 and 95 micromoles/min, and a growth temperature of 970° C. The hydrogen carrier gas flow rate was between 10 and 13 slpm. A high-temperature AlN layer was grown on the denticulated transitional layer using a pressure of 75 Torr, a V/III ratio between 6 and 60, a group III flow rate between 16 and 95 micromoles/min. The high-temperature AlN layer was grown to a thickness of about 1.5 micrometers without cracking. The ultimate dislocation density of the high temperature AlN film grown on the denticulated transitional layer is dependent on its growth conditions and thickness in addition to the growth conditions and thickness of the transitional layer. Growing a transitional layer with the conditions above to a thickness of 0.3 to 0.8 micrometers will typically result in high temperature AlN films (1.5 to 3 micrometer thick) with a density of dislocations with an edge component of $1-6 \times 10^9/cm^2$ (measured by x-ray diffraction). AlN films with lower dislocation density can be achieved by optimization of the growth conditions for the interlayer and especially by growing a thicker transitional layer and high temperature AlN layer.

Figure 9:
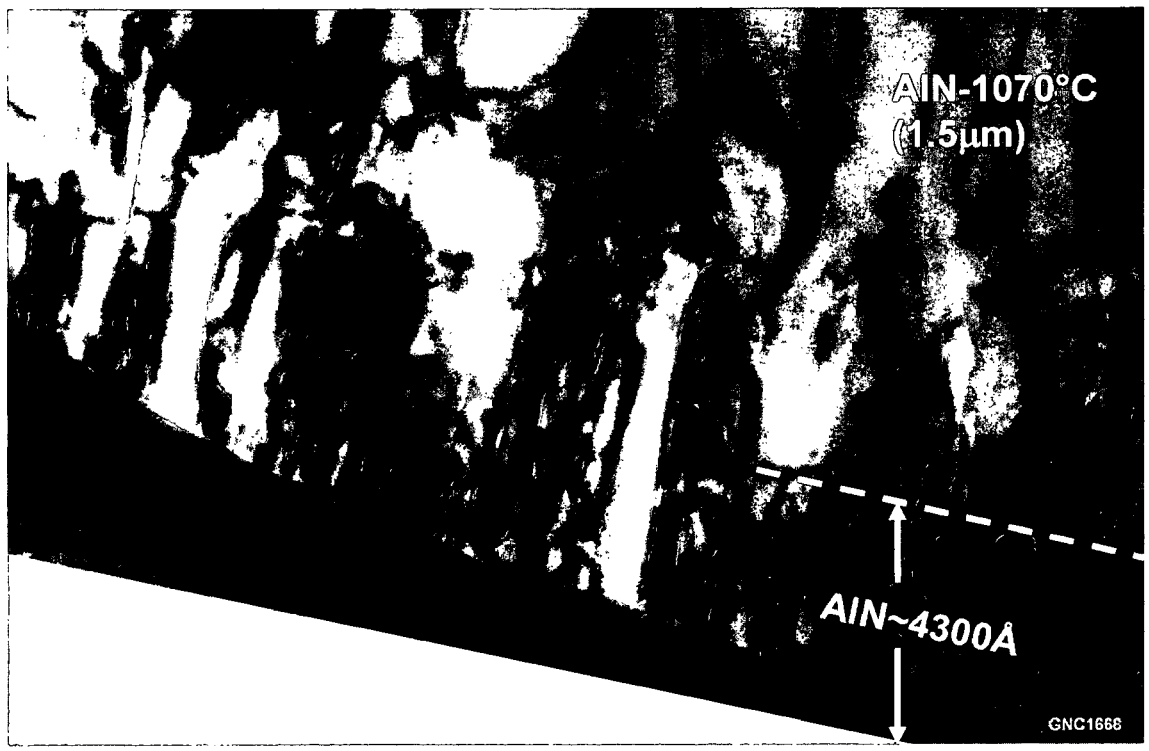
FIG. 9 is a transmission electron micrograph (TEM) image of a structure comprising a denticulated AlN layer that has had a high-temperature AlN layer grown upon it. The AlN denticulated layer was 0.43 micrometer thick. The high-temperature AlN layer was grown at 1070° C. to a thickness of 1.5 micrometers. Threading dislocations are seen to interact and be removed in the 0.6 micrometer region grown on top of the denticulated layer at 1070° C. where the AlN is coalescing.

FIG. 9 presents a transmission electron micrograph (TEM) image that shows the reduction of edge-component threading dislocation density in high-temperature AlN grown on a denticulated layer of 0.43 micrometer thickness. In the 0.6 microns of AlN grown at 1070° C. on top of the denticulated layer, the dislocations are seen to interact and be reduced, resulting in a lower dislocation density in the 0.9 microns of high-temperature AlN above the interaction zone.

Figure 10A:
FIG. 10 shows TEM images of an $Al_{0.63}Ga_{0.67}N$ layer that has been grown on top of a high-temperature AlN layer that was grown on top of a denticulated AlN layer. a) View showing dislocations with an edge component. b) View showing dislocations with a screw component. Mixed dislocations are part screw and part edge in character.
Figure 10B:

FIG. 10 illustrates the use of the denticulated layer as a basis for forming a low-dislocation substrate of AlN for subsequent growth of AlGaN. Dislocations react and are removed in the first 0.6 micrometers of AlN grown at 1070° C. on top of a denticulated layer grown at 1000° C. A layer of $Al_{0.63}Ga_{0.37}N$ was grown on the high-temperature AlN layer to produce lower-dislocation density AlGaN suitable for use in devices.

In some embodiments of this invention, an additional denticulated transitional layer may be grown on the high-temperature AlGaN layer, followed by additional growth of high-temperature AlGaN, to produce further improvements in dislocation density and crack-free thickness. In some embodiments, denticulated layers can be grown on patterned substrates or on patterned substrates comprising layers of GaN, AlGaN or AlN where the substrates have been patterned to form various structures on their surface. Some examples of such structures include but are not restricted to periodic trenches, 1-dimensional or 2-dimensional arrays of grooves and mesas such as, for example a periodic structure that is square-wave in cross section, grooves between pyramidal structures, hexagonal structures such as, for example, 2-dimensional arrays of hexagonal islands with flat mesa tops, 6-sided trapezoidal islands, 6-sided pyramidal structures, and other polygonal structures. The structures can be formed by photolithography and etching or by previous growth conditions. In such embodiments, the patterned surfaces form what is termed a textured substrate. The resulting structure in AlN or AlGaN can also be used to reduce dislocation density and cracking in overgrown AlGaN films.

Embodiments of this transitional layer can use a variety of different thin nucleation layers, as are known to those skilled in the art of III-nitride growth. The AlN or $Al_xGa_{1-x}N$ ($0 \leq x \leq 1$) layer that is grown on top of this transitional layer can be grow under many different conditions as are known to those skilled in the art. Embodiments of this invention have been demonstrated using sapphire and SiC substrates; other substrate materials suitable for growth of III-N materials can also be used in embodiments of this invention. Examples include but are not restricted to sapphire, silicon carbide, silicon, lithium gallate, lithium aluminate, zinc oxide, gallium nitride, aluminum nitride, spinel ($MgAl_2O_4$), hafnium (Hf), and zirconium diboride.

Transitional layers made using embodiments of this invention differ in their behavior from previously reported rough layers of GaN. There is significant mass transport and etching in the growth of GaN. In forming previously reported rough GaN, the previously deposited GaN layer is etched and Ga atoms are redistributed to form large islands that are responsible for a reduction in dislocation density. The roughness scale of a GaN layer is often similar to its total thickness and the GaN is not necessarily a continuous film even with the deposition of additional material. In contrast, the denticulated layer of AlN or high-Al-content $Al_xGa_{1-x}N$ grown in embodiments of this invention grows thicker at an appreciably faster rate than the rate at which it roughens. The denticulated layer films of embodiments of this invention are growing films with surfaces that initially get rougher as the films grow thicker and then exhibit a substantially constant level of roughness as the film grows still thicker.

Embodiments of denticulated layers for reduced threading dislocation densities and cracking can be applied to the growth of electronic and photonic devices to obtain improved performance. In one embodiment, $Al_xGa_{1-x}N$ ($0 \leq x \leq 1$) layers grown on denticulated AlN layers may form the n-type Group III nitride cladding layer of a Group III nitride p-i-n light emitting diode or laser diode structure. Subsequent growth of a Group III nitride quantum well active region and p-type Group III nitride cladding layers comprising $Al_xGa_{1-x}N$ ($0 \leq x \leq 1$) or $In_xGa_{1-x}N$ ($0 \leq x \leq 1$) materials completes the light emitting structure. The reduced dislocation densities that are enabled by the formation of the denticulated layer before growth at higher temperature can improve device performance through increased optical output powers and device lifetimes. Furthermore, the ability to grow thicker cladding layers without cracking enables better optical mode confinement in Group III nitride laser diode structures and reduced lateral resistance in both light emitting diodes and laser diodes grown on insulating substrates. Other device structures that may benefit from the reduced dislocation densities and cracking afforded by this denticulated growth approach include Group III nitride photodetectors and transistors.

The preceding are illustrative embodiments. Specific combinations of reaction parameters to embody this invention in a different reactor will depend on the specific characteristics of the reactor employed. Persons of ordinary skill in the art with typical understanding of the operation of their own reactors are capable of determining suitable corresponding conditions for their reactors without undue experimentation.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A Group III nitride structure, the structure comprising:
    a substrate;
    a denticulated Group III nitride layer, wherein denticles of the denticulated Group III nitride layer are substantially conical and positioned sufficiently closely together to be in contact with adjacent denticles; and
    a Group III nitride layer on top of the denticulated Group III nitride layer,
    wherein the Group III nitride layer is a high-temperature Group III nitride layer, comprising a dislocation-interaction zone epitaxially atop the denticulated Group III nitride layer and a lower-threading-dislocation-density layer epitaxially atop the dislocation-interaction zone.

2. The Group III nitride structure of claim 1, wherein the denticulated Group III nitride layer is grown at a moderate temperature.

3. The Group III nitride structure of claim 2, wherein the moderate temperature is a temperature between approximately 900° C. and 1020° C.

4. The Group III nitride structure of claim 1, wherein a thickness of the denticulated Group III nitride layer is greater than or equal to approximately 0.04 micrometers.

5. The Group III nitride structure of claim 1, wherein the denticulated Group III nitride layer comprises $Al_xGa_{1-x}N$ wherein $0.25 \leq x \leq 1$.

6. The Group III nitride structure of claim 1, further comprising a low-temperature-grown nucleation layer.

7. The Group III nitride structure of claim 1, wherein the substrate is sapphire, silicon carbide, silicon, lithium gallate, lithium aluminate, lithium nitrate, zinc oxide, gallium nitride, aluminum nitride, spinel (MgAl$_2$O$_4$), hafnium (Hf), or zirconium diboride.

8. The Group III nitride structure of claim 1, wherein the substrate comprises a textured substrate.

9. The Group III nitride structure of claim 1, further comprising an n-type Group III nitride cladding layer, a Group III nitride quantum well, and a p-type Group III nitride cladding layer.

10. The Group III nitride structure of claim 1, wherein a base lateral dimension of a majority of denticles of the denticulated Group III nitride layer is between approximately 100 nm and approximately 400 nm and wherein a rms roughness of the denticulated Group III nitride layer is between approximately 10 nm and approximately 30 nm.

* * * * *